United States Patent
Jeng et al.

(12) 
(10) Patent No.: US 6,221,564 B1
(45) Date of Patent: *Apr. 24, 2001

(54) METHOD FOR FORMING A SPACER OUT OF PHOTOSENSITIVE MATERIAL

(75) Inventors: Nanseng Jeng; Christophe Pierrat, both of Boise, ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/133,587

(22) Filed: Aug. 13, 1998

Related U.S. Application Data

(62) Division of application No. 08/661,795, filed on Jun. 13, 1996.

(51) Int. Cl.$^7$ .................................................. G03C 5/16
(52) U.S. Cl. .................. 430/319; 430/313; 430/315; 430/317; 430/326; 430/329; 438/303; 438/595; 438/696; 438/704; 438/734
(58) Field of Search .................................. 430/313, 315, 430/317, 319, 326, 328, 329; 438/394, 303, 595, 696, 704, 734, 745, 785

(56) References Cited

U.S. PATENT DOCUMENTS

| | | | |
|---|---|---|---|
| 4,380,866 | 4/1983 | Countryman, Jr. | 438/130 |
| 4,521,448 * | 6/1985 | Sasaki | 438/586 |
| 4,678,542 | 7/1987 | Boer et al. | 438/479 |
| 4,963,501 | 10/1990 | Ryan et al. | 437/40 |
| 4,978,626 | 12/1990 | Poon et al. | 437/44 |
| 4,994,404 | 2/1991 | Sheng et al. | 438/297 |
| 5,096,802 | 3/1992 | Hu | 430/328 |
| 5,116,460 | 5/1992 | Bukhman | 438/696 |
| 5,132,236 | 7/1992 | Doan | 438/232 |
| 5,134,058 | 7/1992 | Han | 430/327 |
| 5,243,212 | 9/1993 | Williams | 257/344 |
| 5,346,586 | 9/1994 | Keller | 438/694 |
| 5,374,503 | 12/1994 | Sachdev et al. | 430/323 |
| 5,376,483 | 12/1994 | Rolfson | 430/5 |
| 5,393,686 * | 2/1995 | Yeh et al. | 438/264 |
| 5,395,781 | 3/1995 | Wilhoit | 438/303 |
| 5,405,791 | 4/1995 | Ahmad et al. | 437/34 |
| 5,472,890 | 12/1995 | Oda | 437/41 |

(List continued on next page.)

OTHER PUBLICATIONS

Valasek, J., "Introduction to Theoretical and Experimental Optics", *John Wiley & Sons, Inc., New York*, 172–183, (Nov. 17, 1949).

*Primary Examiner*—Bernard Codd
(74) *Attorney, Agent, or Firm*—Schwegman, Lundberg, Woessner & Kluth, P.A.

(57) ABSTRACT

This invention teaches methods and apparatus for forming self-aligned photosensitive material spacers about protruding structures in semiconductor devices. One embodiment of the invention is a method for forming a lightly doped drain (LDD) structure, utilizing disposable photosensitive material spacers. A second embodiment of the invention comprises a method for forming a transistor, having salicided source/drain regions, utilizing photosensitive polyimide spacers for forming the salicided source/drain regions, without disposing of the spacers. A third embodiment of the invention comprises a method for creating an offset from a protruding structure on a semiconductor substrate, using disposable photosensitive material spacers.

24 Claims, 5 Drawing Sheets

U.S. PATENT DOCUMENTS

| | | | |
|---|---|---|---|
| 5,503,964 | 4/1996 | Nishina et al. | 430/329 |
| 5,518,940 | 5/1996 | Hodate et al. | 437/41 |
| 5,610,088 | 3/1997 | Chang et al. | 438/231 |
| 5,627,084 | 5/1997 | Yamazaki et al. | 437/21 |
| 5,656,414 | 8/1997 | Chou et al. | 430/312 |
| 5,714,413 * | 2/1998 | Brigham et al. | 438/301 |
| 5,721,175 | 2/1998 | Kunishima et al. | 438/542 |
| 5,804,338 | 9/1998 | Lim et al. | 430/5 |
| 5,840,447 | 11/1998 | Peng | 430/5 |
| 5,904,529 | 5/1999 | Gardner et al. | 438/286 |

* cited by examiner

METHOD FOR FORMING A SPACER OUT OF PHOTOSENSITIVE MATERIAL

This application is a divisional of U.S. Ser. No. 08/661,795 filed Jun. 13, 1996.

This invention was made with government support under Contract No. MDA972-92-C-0054, awarded by Advanced Research Projects Agency (ARPA). The Government has certain rights in this invention.

FIELD OF THE INVENTION

This invention relates to methods for forming photosensitive material spacers in the manufacture of semiconductor devices.

BACKGROUND OF THE INVENTION

Semiconductor processing often requires spacers for ion implantation. Spacers have been used in process steps, such as transistor lightly-doped drain (LDD) formation and source/drain implantation. LDDs are utilized to reduce hot electron effects in MOS devices. These structures absorb some of the potential in the drain and reduce the resulting electric field. Reducing the electric field also reduces hot electron-induced gate currents, increasing device stability.

In the past, nitride and oxide materials have been utilized for LDD fabrication spacers. Two source/drain implantations are done after formation of a gate. Source/drain regions immediately adjacent to the gate are lightly-doped, and source/drain regions farther from the gate are heavily-doped. Spacers are formed alongside the gate after a light source/drain implantation. Then, a second ion implantation forms heavily-doped regions within the already implanted source/drain regions, farther from the gate. However, spacers can be formed prior to the light source/drain implantation. Then, the source/drain region is heavily-doped with an implantation adjacent to the spacers. Subsequently, the spacers are removed and a lightly-doped implant region is formed adjacent to the gate.

Oxide spacers are often utilized in the formation of self-aligned source/drain regions in metal-oxide-semiconductor (MOS) devices. Self-aligned source/drain silicide (salicide) films are utilized to decrease circuit resistance in devices. As devices shrink, circuit resistance increases. Furthermore, sheet resistivity of shallow-junctions of source/drain regions also increases. Therefore, saliciding processes attempt to overcome this increased resistance. Spacers are formed alongside the gate after source/drain implantation. Then, a refractory metal silicide is formed alongside the spacers. Silicide can be formed in a variety of ways, such as by depositing a layer of refractory metal and annealing, or depositing a refractory metal silicide. Subsequent contacts to the silicided source/drain regions have decreased resistance throughout the contact area.

The common process flow to form a spacer is first to deposit a conformal film, like oxide or nitride, followed by a dry etch. Due to the dry etch process step, the silicon substrate and gate oxide integrity may be degraded. As a result, damaged layers will etch at a faster rate, undesirably altering the thickness of the layers. Another limitation of using oxide or nitride for spacer material is that such layers are often deposited using a high temperature deposition step, which may cause undesirable dopant migration, reflow at undesired times, or other unwanted effects in surrounding device areas. Another problem with using oxide and nitride films for spacer material is that they may not always be removed after the implantation step. Ions implanted into such layers diffuse during subsequent thermal process steps. Thus, if such layers are not of adequate thicknesses, it is hard to control the diffusion of unwanted impurities into device regions masked by the spacers.

There is a need for a spacer material which does not subject surrounding device regions to implantation damage or damage caused by dry etching to form the spacer, as in the case of oxides and nitrides. There is a need for a spacer, which is easy to define on a substrate without the need for precise masking steps. There is a further need for a spacer material that does not require high temperature deposition and is easily removed after its use.

SUMMARY OF THE INVENTION

Spacers are formed in semiconductor devices by controllably exposing and developing a photosensitive material, such that spacers remain, self-aligned with structures formed on substrates. Further processing steps, such as ion implantation, are then performed, with the unexposed photosensitive material masking out the ions. The spacers can then be removed using wet chemical etches. The formation of the spacer does not require high temperatures and, thus, does not damage the substrate. In addition, the spacers are self-aligned with the edges of the structures (topography).

In one embodiment of the invention, a method for forming a lightly-doped drain (LDD) structure on a semiconductor wafer comprises the steps of: defining active areas on the wafer; forming at least one gate on the semiconductor wafer in a defined active area; depositing a photosensitive material onto the wafer; controllably exposing the photosensitive material; developing the photosensitive material to form at least one spacer alongside the gate; implanting a first dose of ions into the active areas; removing the spacers; and implanting a second dose of ions into the active areas.

In another embodiment of the invention, a method for forming a LDD structure on a semiconductor wafer comprises the steps of: defining active areas on the wafer; forming at least one gate on the semiconductor wafer, in a defined active area; implanting a first dose of ions into the active areas, adjacent to the gate; depositing a photosensitive material onto the wafer; controllably exposing the photosensitive material; developing the photosensitive material to form at least one spacer alongside the gate; implanting a second dose of ions into the active area; and removing the spacers.

In another embodiment of the invention, a method for forming a transistor, having salicided source/drain regions on a semiconductor wafer, comprises the steps of: defining active areas; forming at least one gate on the semiconductor wafer in a defined active area; doping source/drain regions; depositing photosensitive polyimide onto the wafer; controllably exposing the polyimide; developing the polyimide to form self-aligned spacers alongside the gate; and forming silicide on the source/drain regions. The spacers are not removed in this embodiment of the invention because polyimide is more stable at high temperatures than other photosensitive material, such as conventional photoresist.

In yet another embodiment of the invention, disposable spacers, formed from unexposed photosensitive material, are utilized to create offsets from protruding structures on a substrate. Use of such disposable spacers permits the formation of complex topographies due to their ease of fabrication and removal.

Spacers, formed from unexposed photosensitive material, are much easier to use than prior art spacers, such as oxide and nitride spacers. Such spacers do not require dry etching for their formation, as do oxide and nitride spacers. Thus, the problem of dry etch-induced lattice damage to surrounding material, such as the gate oxide or silicon substrate, is not present when using spacers described in the invention. Another advantage of using such a spacer is that it does not require a high temperature deposition step and it is easily removed. Due to diffraction and phase shift along the edges of structures during exposure of the photosensitive material, the spacers are formed self-aligned with the structures. No mask or precise alignment of a mask is required, but may be used if desired.

DETAILED DESCRIPTION

This invention overcomes problems associated with spacers utilized in the past, by utilizing photosensitive material to form such spacers, self-aligned with topographical structural edges in various semiconductor processing steps. By utilizing photosensitive material for spacers, a high temperature deposition step is not required, and dry etching is not required to define the spacers. Therefore, the substrate is not damaged during spacer formation. Problems associated with implantation damage are not present when photosensitive material is used as the spacer material. Furthermore, the spacers are easily removed by an oxygen plasma, followed by a wet chemical, such as suliric acid, or a hydrogen peroxide solution.

Figure 1:
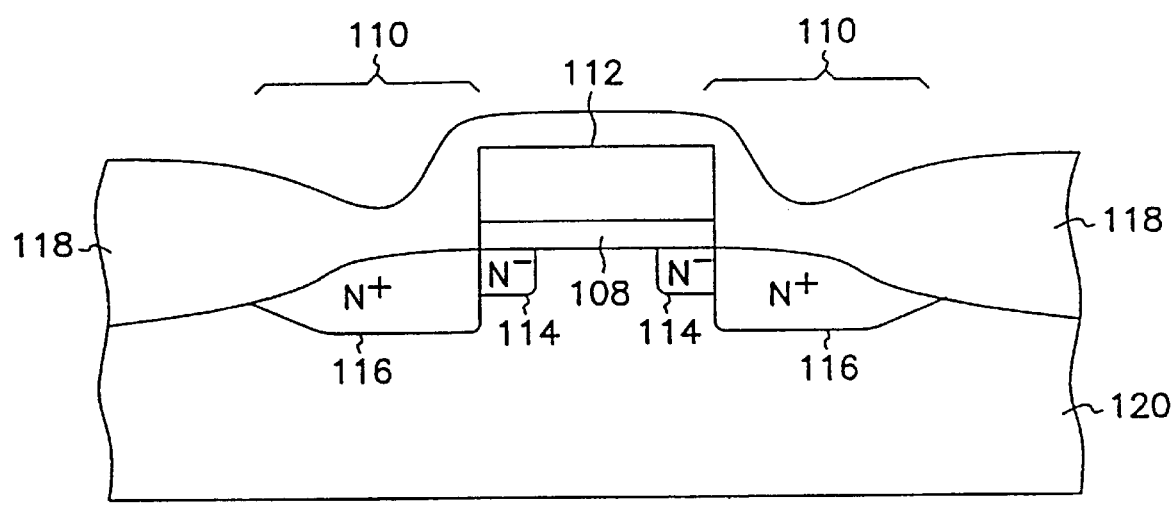
FIG. 1 is a cross-sectional illustration representing a LDD structure, fabricated utilizing disposable photosensitive material spacers.

Disposable photosensitive material spacers are utiized in the fabrication of lightly-doped drain (LDD) structures. One such structure is shown in FIG. 1. A gate 112 is formed over a gate oxide layer 108. The source/drain 110 of an LDD structure is then formed using two subsequent implants and disposable photosensitive material spacers. The first implant is self-aligned with gate 112 and spacers (not shown) formed on both sides of the gate 112. The second implant is self-aligned with only the gate 112, following removal of the spacers. The result is formation of a lightly-doped section 114 of the source/drain 110, at the edge near the gate 112 and a more heavily-doped section 116 next to that region. Subsequent drive-in steps cause the implanted dopants to spread out by diffusing through the substrate 120. Thus, as FIG. 1, the lightly-doped 114 and heavily-doped regions 116 are not always confined to the initial implant areas. Remaining elements of the LDD structure illustrated in FIG. 1 are well known in the art and are comprised of oxide 118 surrounding the gate 112 and non-active areas of the device, and a semiconductor substrate 120.

Figure 2A:
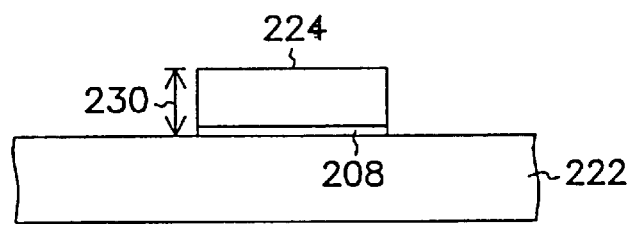
FIGS. 2a–2d are cross-sectional illustrations representing process steps utilized to form the disposable photosensitive material spacers for the LDD structure.

FIGS. 2a–2d illustrate the process steps for forming LDD structures. To form removable spacers on edges of semiconductor structures, a silicon substrate is primed using hexamethyldisilazane (HMDS) vapor at 120 degrees Celsius, prior to coating with a photosensitive material 226, such as photoresist. However, priming is not always necessary, and other agents can be used at different temperatures. Although photoresist material is described in this example, other types of photosensitive material responsive to exposure sources, such as x-rays, ions, and electrons are used in further embodiments, to expose the material, instead of using ultraviolet photons. Such other photosensitive materials and ways of exposing them are well known to one skilled in the art To form disposable spacers, photosensitive material 226 is applied to a wafer 222, having a protruding structure 224, using conventional spinner techniques, as shown in FIG. 2a. In the case of LDD structure formation, the protruding structure 222 is a transistor gate formed over a gate oxide layer 208. The dimensions of the structure may vary, but the gate has a gate height 230, which is the controlling structural variable. The photosensitive material 226 is deposited to a photosensitive material height, which is equal to or greater than the gate height 230. In the preferred embodiment, the photosensitive material height is at least 0.5 microns thicker than the gate height 230. However, depending on the device and application, these dimensions may vary further, and the photosensitive material height may be less than the gate height 230. As devices become increasingly smaller, such heights are expected to decrease. Varying the heights of the gate and photosensitive material do not depart from the scope of this invention.

Figure 2B:
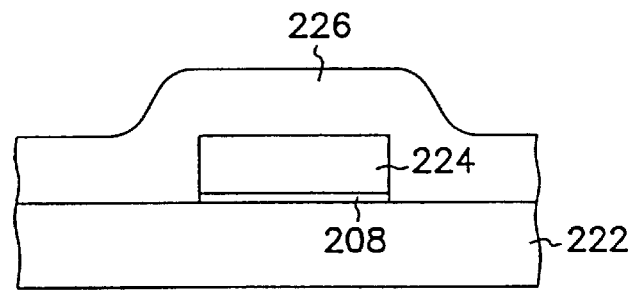

The wafer 222 is spun under controlled velocity and acceleration, spreading photosensitive material 226 in a nearly uniform layer, as shown in FIG. 2b. For example, positive photoresist is used, comprised of a diazonaphtoquinone-type sensitizer in a novolak base resin. Specifically, Sumitomo PFI38A is used. However, any photosensitive material suitable for wafer processing can be used. Various parameters affect the resulting photosensitive material layer properties, including the dimensions of the structure, the energy of ions subsequently implanted, and the type of ions subsequently implanted. However, the photosensitive material height 226 should be approximately 0.5 microns higher than the gate height 230, as shown in FIG. 2a. Following the photosensitive material coating, a soft bake is performed at 90 degrees Celsius, for approximately 60 seconds.

Figure 2C:
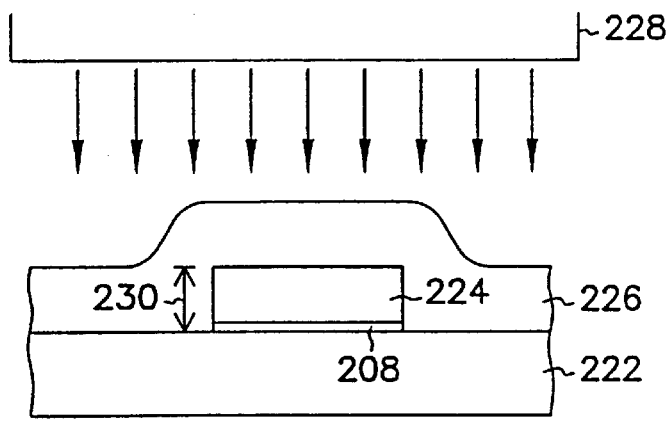

The photosensitive material 226 is next exposed using techniques well known in the art, as shown in FIG. 2c. Such techniques include using contact printers, steppers, and flood ultraviolet (UV) irradiation. When using flood UV irradiation, source 228 exposes the photosensitive material layer 226, to pattern the photosensitive material 226 to be removed. Due to diffraction along the edges of the gate 224 and the phase-shift effect due to the gate height 230, the photosensitive material 226 along the gate 224 edges receive a lower exposure than the photosensitive material 226 covering the gate 224, or other areas of the wafer 222. The wavelength of the UV light used ranges from between approximately 157 to 436 nanometers.

Figure 2D:
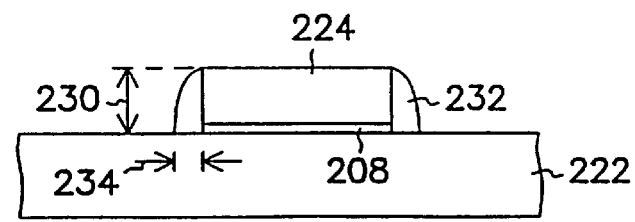

UV exposure time and development time are carefully monitored to form spacers 232 alongside the gate 224, as shown in FIG. 2d. Exposure to UV light destroys the sensitizer in the photosensitive material, which is a photoactive compound (PAC). Destroying the PAC causes optical bleaching. Values of bleachable absorption coefficient, the non-bleachable absorption coefficient, and the bleach rate affect the exposure time needed. Destroying the PAC also increases the solubility rate of the novolak resin in basic developers. Thus, development time is directly correlated with exposure time. Photosensitive material thickness plays a role in the exposure time needed for forming spacers. Light intensity decreases with depth due to light absorption by the photoresist. Therefore, thicker photosensitive material layers require longer exposure times. Intensity at the photosensitive material surface also affects exposure time needed. Adjustments may be made to these process parameters without departing from the scope of the invention. A post-exposure bake at 115 degrees Celsius for approximately 60 seconds is then done. This post-exposure bake is not required for all types of photosensitive materials used.

The width 234 of the spacers 232 varies according to the exposure time, development time, and gate height 230, as shown in FIG. 2*d*. Adjustments are made to the process variables to achieve spacers of different widths, depending on ones preference and needs.

When using a stepper for exposing the photosensitive material, an ASML/100 i-line stepper can be used. A wavelength of 365 nanometers is used with a numerical aperature (NA) of 0.54, with an energy of 110 mJ/cm$^2$. The partial coherence or filling factor, sigma, is 0.62. A post-exposure bake at 115 degrees Celsius for approximately 60 seconds is then performed. This post-exposure bake is not required for all types of photosensitive materials used.

The photosensitive material is then developed using an MIF300 Shipley Developer, based on tetramethyl ammonium hydroxide (TMAH) in a water solution, for approximately 60 seconds. Other developing solutions and equipment can be used, as is well known to one skilled in the art. The result is that spacers are formed self-aligned about the edges of structures without having to perform precise alignments and generation of a mask. However, a mask may be used where a spacer is not desired adjacent all protruding structures.

Subsequent processing steps for forming LDD structures comprise the following: implanting a first dose of ions to a first concentration level, removing the spacers, and implanting a second dose of ions to a second concentration level. In a typical NMOS device, the first dose of ions is typically arsenic at a dose of about $1-5\times10^{15}$ arsenic atoms/cm$^2$. The second dose of ions is typically phosphorus at a dose of about $1-2\times10^{13}$ phosphorus atoms/cm$^2$. In a typical PMOS device, the first dose of ions is typically boron at a dose of about $1-5\times10^{15}$ boron atoms/cm$^2$. The second dose of ions is typically boron at a dose of about $1-2\times10^{13}$ boron atoms/cm$^2$. Photosensitive material spacers are easily removed using any of a number of conventional removal techniques. These include organic strippers, oxidizing-type strippers, or dry etching techniques. Commonly used organic strippers are comprised of: phenol-based strippers, low-phenol, and phenol-free organic strippers. Commonly used oxidizing-type strippers are comprised of suliric acid and hydrogen peroxide solutions. Dry etching is usually performed using a dry oxygen plasma. In this example, an oxygen plasma etch is followed by application of a wet sulfuric and hydrogen peroxide mixture at 120 degrees Celsius.

In another embodiment of the invention for forming LDD structures, spacers are formed in accordance with the method recited above, but not until after a light, first source/drain implantation is done. In a typical NMOS device, this first dose of ions is typically phosphorus at a dose of about $1-2\times10^{13}$ phosphorus atoms/cm$^2$. Subsequent to forming the resist spacers, a heavy, second source/drain implantation forms a heavily-doped region farther away from the gate than the lightly-doped region formed with the first implantation. In a typical NMOS device, this second dose of ions is typically arsenic at a dose of about $1-5\times10^{15}$ arsenic atoms/cm$^2$. PMOS devices are formed in similar ways, except for changes in implanted species and doses. In a typical PMOS device, the first dose of ions is typically boron at a dose of about $1-5\times10^{15}$ boron atoms/cm$^2$. The second dose of ions is typically boron at a dose of about $1-2\times10^{13}$ boron atoms/cm$^2$. The spacers are removed in accordance with the method recited above. An insulating layer is then deposited over the entire structure.

Figure 3:
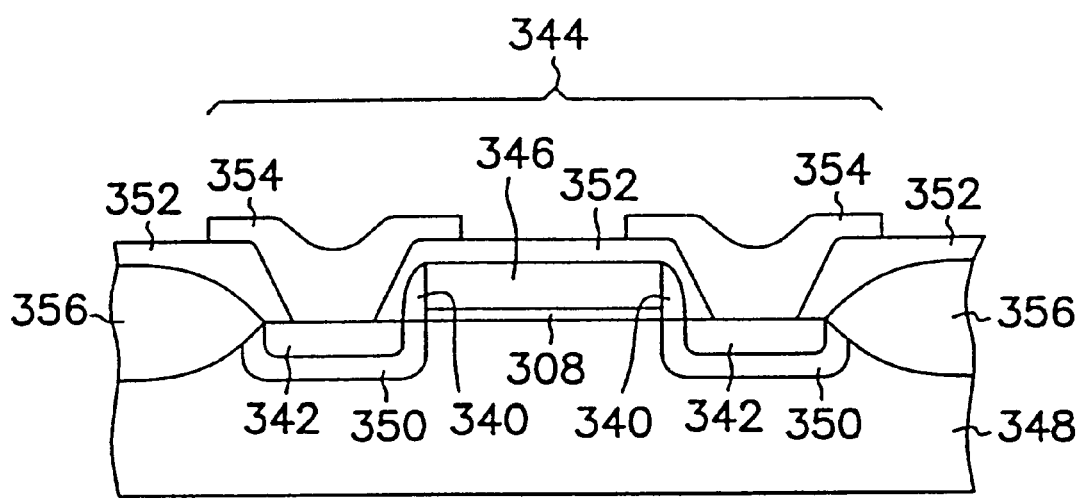
FIG. 3 is a cross-sectional illustration representing salicided source/drain regions in a MOS transistor, fabricated utilizing spacers, formed from photosensitive material.

In another embodiment of the invention, photosensitive material spacers 340 are utilized in forming salicided source/drain regions 342 of a MOS transistor 344, as shown in FIG. 3. Spacers 340 are formed on the sides of gate 346, overlying a gate oxide layer 308 and semiconductor substrate 348. The spacers 340 control the distance of the salicided regions 342 from the gate 346, within the source/drain regions 350. Spacers 340 are formed out of a photosensitive polyimide. A typical photosensitive polyimide is comprised of polyimic acid, polyimic ester, PAC, and a solvent, such as normal methylpyrrolidone (NMP). When forming silicided source/drain regions 342 in MOS transistors, as shown in FIG. 3, by depositing titanium and annealing to form titanium silicide 342, high temperature stability is required. Photosensitive polyimide spacers 340 are more stable at high temperatures than conventional photoresist. Therefore, they do not need to be removed. Such polyimide spacers 340 can be used in other applications, where it is necessary that the spacers 340 remain on a structure during subsequent high temperature processing steps. Subsequent process steps include forming metal contacts 354 over the contact areas, which extend to the salicided source/drain regions 342. Field oxide 356 isolates each transistor 344 on a die.

Figure 4A:
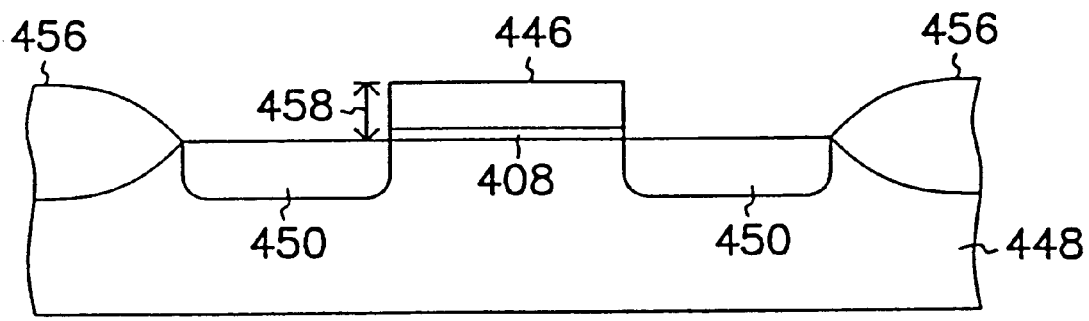
FIGS. 4a and 4b are cross-sectional illustrations representing process steps utilized to form the photosensitive material spacers for the MOS transistor structure shown in FIG. 3.
Figure 4B:
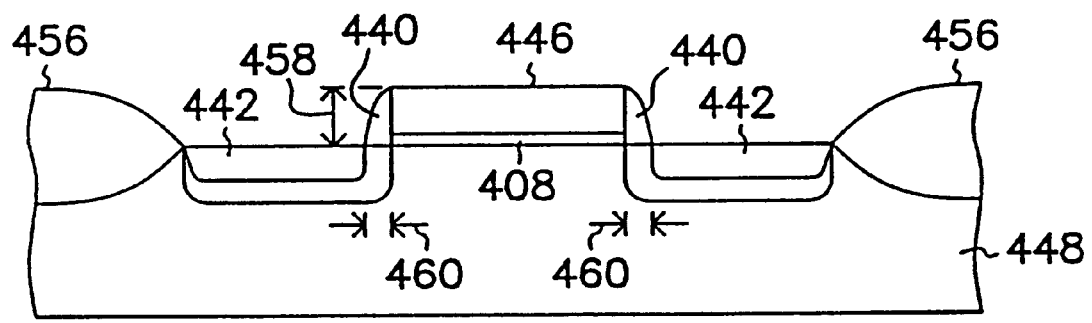

The steps necessary for fabricating spacers formed from photosensitive material in the MOS transistor, shown in FIG. 3, are illustrated in FIGS. 4*a* and 4*b*. A gate 446 on a gate oxide layer 408 and semiconductor substrate 448, field oxide 456, and doped source/drain regions 450 are created utilizing conventional techniques, as shown in FIG. 4*a*. Salicided source/drain regions 442 are then formed by creating spacers 440 alongside the gate 446, as shown in FIG. 4*b*.

The steps needed to form the spacers 440, as shown in FIG. 4*b*, are similar to those utilized in forming the spacers for the LDD structure. Photosensitive material is applied to the transistor base structure using the same methods as described previously with LDD structures. As previously stated, the height 458 of the gate, as shown in FIG. 4*a*, is the controlling structure variable for forming the spacers.

Subsequent processing steps in forming MOS transistor structures, as shown in FIG. 3, comprise the following: depositing an insulating layer 352 over the device, etching the insulating layer 352 to form contact holes, depositing metal over the device, and etching the metal to define metal contact lines 354.

Figure 5A:
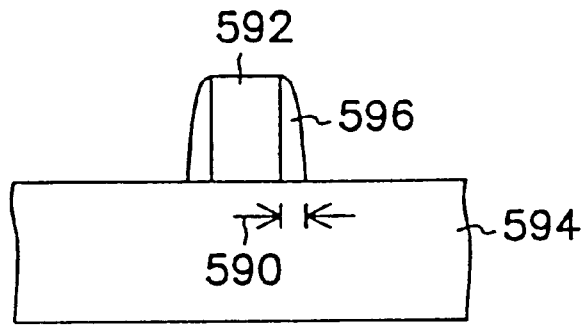
FIGS. 5a–5c are cross-sectional illustrations representing the process steps utilized to create an offset from a protruding structure, using disposable photosensitive material spacers.
Figure 5B:
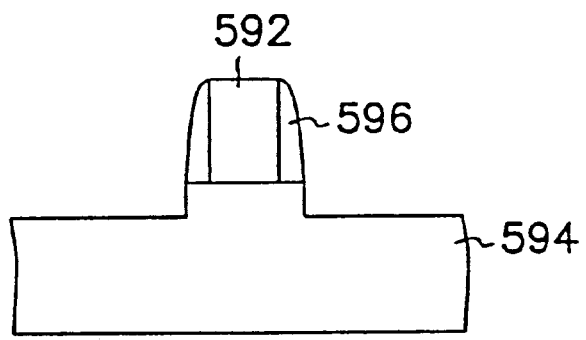
Figure 5C:
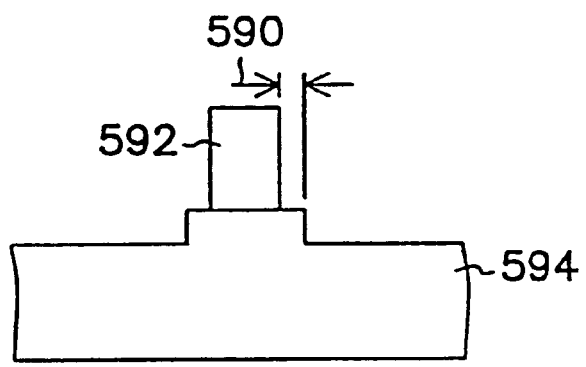

In another embodiment of the invention, photosensitive material spacers are utilized to create offsets from certain structures, including those which have complicated topographies. The structure can be any protruding structure, such as a gate in a transistor or a silicon substrate recess, prior to field oxidation. The invention is used to obtain an offset 590 from a structure 592 as shown in FIGS. 5*a*–5*c*. A substrate 594 is provided, on which a protruding structure 592 is defined. The substrate 594 and the structure 592 can be of the same type of material, but it is not necessary for the practice of this invention.

Spacers 596 are created on the sides of the structure 592 by the method described previously for LDD structures, as shown in FIG. 5a. Portions of the substrate 594 are removed by either a wet or dry etch, as well known to one skilled in the art and shown in FIG. 5b. The spacers 596 are then removed, leaving an offset 590 from the structure 592, as shown in FIG. 5c. Disposable photosensitive material spacers 596 are capable of forming such complex topographies due to their ease of fabrication and disposal.

In the above-described embodiments, spacers, formed from photosensitive material, provide many advantages over prior art spacers, such as oxide and nitride spacers. Such spacers do not require dry etching for their formation, as do oxide and nitride spacers. Thus, the problem of lattice damage to surrounding material, such as the gate oxide or silicon substrate, is not present when using the spacers of the invention. Another advantage of using a disposable spacer is that it does not require a high temperature deposition step and it is easily removed. However, when subsequent high temperature steps are required, polyimide spacers are a suitable material, which do not need to be removed.

It should be noted that in MOS technology, many times certain areas of the semiconductor die described as having a particular doping, could quite easily be of a different doping, promoting a different type of charge carrier. In such instances, if one were to reverse the primary carriers in all areas of the die and adjust for carrier mobility, the invention would operate in an equivalent manner.

What is claimed is:

1. A method for forming a transistor having salicided source/drain regions on a semiconductor wafer, comprising:

forming at least one gate on the semiconductor wafer, over a defined active area;

doping the source/drain regions;

coating the gate and the wafer with a uniform layer of photosensitive material suitable for use as a spacer alongside the gate;

forming at least one photosensitive material spacer alongside the gate, wherein forming at least one photosensitive material includes exposing the photosensitive material for a controlled exposure time without any use of a photo mask, wherein exposing the photosensitive material for the controlled exposure time includes exposing the photosensitive material such that diffraction along an edge of the gate causes the photosensitive material along the edge of the gate to receive a lower exposure than the photosensitive material covering the gate or other areas of the wafer;

forming silicide on the source/drain regions; and depositing an insulator layer onto the semiconductor wafer.

2. The method of claim 1, wherein the gate has a gate height and the photosensitive material is deposited onto the wafer to a photosensitive material height when forming the photosensitive material spacer, such that the photosensitive material height is at least approximately 0.5 microns greater than the gate height.

3. The method of claim 1, wherein exposing the photosensitive material includes exposing the photosensitive material wherein the exposure source for the technique is selected from the group of x-rays, inons, electrons, and ultraviolet radiation, and the method further includes developing the photosensitive material.

4. A method for forming a transistor having salicided source/drain regions on a semiconductor wafer, comprising:

forming at least one gate on the semiconductor wafer, over a defined active area;

doping the source/drain regions;

coating the gate and the wafer with a uniform layer of photosensitive material suitable for use as a spacer alongside the gate;

forming at least one photosensitive material spacer alongside the gate, wherein forming at least one photosensitive material includes exposing the photosensitive material in a controlled exposure time without any use of a photo mask, wherein exposing the photosensitive material in the controlled exposure time includes exposing the photosensitive material such that diffraction along an edge of the gate causes the photosensitive material along the edge of the gate to receive a lower exposure than the photosensitive material covering the gate or other areas of the wafer, wherein the exposure source for the technique is selected from the group consisting of x-rays, ions, electrons, and ultraviolet radiation;

forming silicide on the source/drain regions; and depositing an insulator layer onto the semiconductor wafer.

5. A method for forming a transistor on a semiconductor wafer, comprising:

forming a gate on the semiconductor wafer, over a defined active area;

doping the source/drain regions;

forming a photosensitive material spacer alongside the gate, wherein forming the photosensitive material spacer includes coating the gate with a layer of photosensitive material suitable for use as the spacer, flood exposing the photosensitive material for a controlled length of time, wherein flood exposing the photosensitive material for the controlled length of time includes exposing the photosensitive material such that diffraction along an edge of the gate causes the photosensitive material along the edge of the gate to receive a lower exposure than the photosensitive material covering the gate or other areas of the wafer, and developing the photosensitive material.

6. The method of claim 5, wherein forming the transistor further comprises:

forming silicide on the source/drain regions; and depositing an insulator layer onto the semiconductor wafer.

7. The method of claim 5, wherein forming a gate on the semiconductor wafer includes forming the gate with a gate height and coating the gate with a layer of photosensitive material includes depositing the photosensitive material onto the wafer to a photosensitive material height, such that the photosensitive material height is at least approximately 0.5 microns greater than the gate height.

8. The method of claim 5, wherein coating the gate with a layer of photosensitive material includes by coating the gate with a polyimide material.

9. The method of claim 5, wherein doping the source/drain regions includes ion implanting the semiconductor wafer with ions, except under the spacers.

10. The method of claim 5, wherein forming the transistor further includes removing the spacers.

11. The method of claim 10, wherein removing the spacers includes using wet chemicals.

12. A method for forming a transistor on a semiconductor wafer, comprising:

forming a gate having vertical edges on the semiconductor wafer;

forming a photosensitive material spacer alongside the gate, wherein forming the photosensitive material spacer includes coating the gate with a layer of photosensitive material suitable for use as the spacer, flood exposing the photosensitive material without any use of a photomask such that diffraction along the edges of the gate causes the photosensitive material along the gate edges to receive a lower exposure than the photosensitive material covering the gate or other areas of the wafer, and developing the photosensitive material; and then doping a source and a drain region on the semiconductor wafer.

13. The method of claim 12, wherein flood exposing the photosensitive material includes flood exposing the photosensitive material for a controlled length of time.

14. The method of claim 12, wherein forming the transistor further comprises:

forming silicide on the source/drain regions; and depositing an insulator layer onto the semiconductor wafer.

15. The method of claim 12, wherein doping the source and the drain regions includes ion implanting the semiconductor wafer with ions, except under the spacers.

16. The method of claim 12, wherein forming the transistor further includes removing the spacers.

17. The method of claim 12, wherein removing the spacers includes using wet chemicals.

18. The method of claim 12, wherein forming a gate on the semiconductor wafer includes forming the gate with a gate height, and wherein coating the gate with a layer of photosensitive material includes depositing the photosensitive material onto the wafer to a photosensitive material height, such that the photosensitive material height is greater than the gate height.

19. The method of claim 12, wherein the times of exposure and development are sufficient to remove photosensitive material from horizontal surfaces of the gate, but not long enough to remove the photosensitive material from vertical surfaces of the gate.

20. The method of claim 12, wherein flood exposing the photosensitive material for a controlled length of time includes irradiating the structure with ultraviolet light, wherein the wavelength of the ultraviolet light is between approximately 157 to 436 nanometers.

21. A method for forming a transistor on a semiconductor wafer, comprising:

forming a gate having edges and a gate height on the semiconductor wafer;

implanting ions into a source region and a drain region for the transistor; and forming a photosensitive material spacer alongside the gate, wherein forming the photosensitive material spacer includes coating the semiconductor wafer with a uniform layer of photosensitive material suitable for use as the spacer, flood exposing the photosensitive material without any use of a photomask such that a phase shift effect, due to the gate height and the edges of the gate, causes the photosensitive material along the gate edges to receive a lower exposure than the photosensitive material covering the gate or other areas of the wafer, and developing the photosensitive material.

22. The method of claim 2, wherein implanting ions into a source region and a drain region for the transistor is performed subsequent to forming a photosensitive material spacer alongside the gate.

23. The method of claim 2, wherein coating the semiconductor wafer with a uniform layer of photosensitive material includes depositing the photosensitive material to a height which is at least 0.5 microns greater than the gate height.

24. The method of claim 2, wherein flood exposing the photosensitive material for a controlled length of time includes irradiating the structure with ultraviolet light, wherein the wavelength of the ultraviolet light is between approximately 157 to 436 nanometers.

* * * * *

UNITED STATES PATENT AND TRADEMARK OFFICE
CERTIFICATE OF CORRECTION

PATENT NO. : 6,221,564 B1  
DATED : July 20, 2001  
INVENTOR(S) : Nanseng Jeng and Christophe Pierrat Page 1 of 1

It is certified that error appears in the above-identified patent and that said Letters Patent is hereby corrected as shown below:

Column 7,
Line 64, insert -- consisting -- between "group" and "of"; also delete "inons" and insert -- ions --, therefor.

Column 8,
Line 58, delete "by".

Column 10,
Line 26, delete "claim 2" and insert -- claim 21 --, therefor.
Line 30, delete "claim 2" and insert -- claim 21 --, therefor.
Line 34, delete "claim 2" and insert -- claim 21 --, therefor.

Signed and Sealed this

Sixteenth Day of April, 2002

Attest:

Attesting Officer

JAMES E. ROGAN
*Director of the United States Patent and Trademark Office*